(12) United States Patent
Andersson et al.

(10) Patent No.: US 9,450,538 B2
(45) Date of Patent: Sep. 20, 2016

(54) HARMONIC REJECTION MIXER ARRANGEMENT

(71) Applicant: Telefonaktiebolaget L M Ericsson (publ), Stockholm (SE)

(72) Inventors: Martin Andersson, Loddekopinge (SE); Lars Sundstrom, Sodra Sandby (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 14/394,956

(22) PCT Filed: Apr. 3, 2013

(86) PCT No.: PCT/EP2013/057011
§ 371 (c)(1),
(2) Date: Oct. 16, 2014

(87) PCT Pub. No.: WO2013/156305
PCT Pub. Date: Oct. 24, 2013

(65) Prior Publication Data
US 2015/0070071 A1    Mar. 12, 2015

Related U.S. Application Data

(60) Provisional application No. 61/638,066, filed on Apr. 25, 2012.

(30) Foreign Application Priority Data

Apr. 19, 2012   (EP) .................................... 12164771

(51) Int. Cl.
  G06F 7/44    (2006.01)
  H03D 7/14    (2006.01)
  H03D 7/16    (2006.01)
(52) U.S. Cl.
  CPC .......... *H03D 7/1491* (2013.01); *H03D 7/1458* (2013.01); *H03D 7/165* (2013.01); *H03D 7/1466* (2013.01); *H03D 7/1475* (2013.01); *H03D 2200/0086* (2013.01)

(58) Field of Classification Search
CPC ............. H03D 7/1485; H03D 7/1466; H03D 7/1475; H03D 7/1484; G06G 7/163
USPC ......................... 327/355–361; 455/323, 326
See application file for complete search history.

(56) References Cited

U.S. PATENT DOCUMENTS 8,217,693 B2 * 7/2012 Mei ........................ H03L 7/0896
                                                              327/148
8,624,660 B2 * 1/2014 Sundstrom ........... H03D 7/1458
                                                              327/355

(Continued)

FOREIGN PATENT DOCUMENTS

EP    1560326 A1    8/2005
EP    1786097 A1    5/2007

(Continued)

OTHER PUBLICATIONS

International Preliminary Report on Patentability, mailed Oct. 30, 2014, in connection with International Application No. PCT/EP2013/057011, all pages.

(Continued)

*Primary Examiner* — Dinh T Le
(74) *Attorney, Agent, or Firm* — Laffler Intellectual Property Law, PLLC

(57) ABSTRACT

It is disclosed a mixer arrangement for complex signal mixing comprising a first harmonic rejection mixer, and a second harmonic rejection mixer. Each of the harmonic rejection mixers comprises mixer unit cells wherein each mixer unit cell comprises a differential input, transconductance elements corresponding to the differential input, and a switching network arranged to switch signals from the transconductance elements to a differential output, and the first and the second harmonic rejection mixers have mutual quadrature phase relationship. The first and the second rejection mixer share a plurality of mixer unit cell, each comprising an input for receiving a signal to be mixed, an input for receiving control signals derived from a local oscillator signal, and one output for each of the first and second harmonic rejection mixers. A radio circuit comprising such a mixer arrangement and a communication apparatus comprising such a radio circuit are also disclosed.

15 Claims, 12 Drawing Sheets

(56) References Cited

U.S. PATENT DOCUMENTS

| | | | |
|---|---|---|---|
| 9,017,197 B2* | 4/2015 | Foster | F16H 7/1227 474/135 |
| 2006/0205370 A1 | 9/2006 | Hayashi et al. | |
| 2009/0174459 A1 | 7/2009 | Cicalini | |
| 2009/0280762 A1 | 11/2009 | Park et al. | |
| 2011/0102051 A1 | 5/2011 | Zeller | |
| 2012/0049926 A1 | 3/2012 | Shimizu et al. | |

FOREIGN PATENT DOCUMENTS

| | | |
|---|---|---|
| WO | 2005/091493 A1 | 9/2005 |
| WO | 2008/008759 A2 | 1/2008 |
| WO | 2010/000603 A1 | 1/2010 |
| WO | 2011/070013 A2 | 6/2011 |
| WO | 2012/038338 A1 | 3/2012 |

OTHER PUBLICATIONS

PCT International Search Report, mailed Jul. 22, 2013, in connection with International Application No. PCT/EP2013/057011, all pages.

PCT Written Opinion, mailed Jul. 22, 2013, in connection with International Application No. PCT/EP2013/057011, all pages.

Extended European Search Report, mailed Oct. 18, 2012, in connection with European Patent Application No. 12164771.3-2215, all pages.

Weldon, Jeffrey A. et al. "A 1.75-GHz Highly Integrated Narrow-Band CMOS Transmitter with Harmonic-Rejection Mixers" IEEE Journal of Solid-State Circuits, Dec. 1, 2001, IEEE, Piscataway, New Jersey, USA, vol. 36, No. 12, XP011061664, pp. 2003-2015.

* cited by examiner

HARMONIC REJECTION MIXER ARRANGEMENT

CROSS-REFERENCE TO RELATED APPLICATIONS

This application claims priority under 35 U.S.C. §119 to European Patent Application No. 12164771.3, filed Apr. 19, 2012, which is hereby incorporated herein by reference in its entirety. This application also claims the benefit of U.S. Provisional Application No. 61/638,066, filed Apr. 25, 2012, which is hereby incorporated herein by reference in its entirety.

TECHNICAL FIELD

The present invention generally relates to a mixer arrangement for complex signal mixing, a radio circuit and a communication apparatus.

BACKGROUND

Mixers are widely used in radio technology. A harmonic mixer, sometimes called a sampling mixer, mixes a signal with a pulse sequence representing the oscillator signal, wherein the pulse sequence has a fundamental frequency equal to a desired frequency translation frequency, and wherein switches can be used in the mixer. This has advantages in design in sense of power consumption and ability to operate at high frequencies. Due to the properties of the pulses, harmonics are generated. For alleviating this, and still keep the advantages of the harmonic mixer, the mixing can be performed at several mixer unit cells and the output from these are added, sometimes with opposite signs, i.e. a subtraction, to form an aggregate output signal more resembling the one of a time-continuous mixing with a sinusoid oscillator signal. US 2009/0280762 A1 discloses a high-order harmonic rejection mixer using a current steering technique. The mixer generates a sinus-like signal by an input current generation unit generating and outputting an input current corresponding to an input signal, a first path circuit unit including a plurality of transistors having sources connected in common to the input current generation unit, a second path circuit including a plurality of transistors having sources connected in common to the input current generation unit, and a load unit connected to drains of the transistors of the first path circuit, while the drains of the transistors of the second path circuit are connected to ground. A local oscillator signal is phase shifted in steps corresponding to the plurality of transistors in the paths and are connected to the gates of the transistors with in-phase polarity to the transistors of the first circuit path and with opposite phase polarity to the transistors of the second circuit path. The transconductance of each of the transistors of the first path circuit is determined such that current passing through the transistors are turned on or off according to the phase-shifted oscillator signal to resemble a sinusoidal waveform.

Complex mixers provide a division of the mixed signal in an in-phase down-converted signal and a quadrature-phase down-converted signal. This can be provided by arranging one mixer arrangement for the in-phase purpose, and one mixer arrangement for the quadrature-phase purpose, with oscillator signals thereto arranged in proper phase.

Mixers arranged to deal with two or more carriers are normally arranged by multiplying the number of mixers in the arrangements accordingly.

When all the considerations above aggregates in a mixer design, the amount of circuitry rapidly expands. In circuit design, this requires a considerable layout size, which may cause one or more of the following problems: cost, size, power consumption, and signal path considerations (due to high-frequency issues).

It is therefore a desire to alleviate such problems.

SUMMARY

An object of the invention is to at least alleviate the above stated problem. The present invention is based on the understanding that provision of a design of a versatile mixer unit cell together with an approach of letting mixers of a mixer arrangement share those mixer unit cells where appropriate can reduce the amount of circuitry.

According to a first aspect, there is provided a mixer arrangement for complex signal mixing comprising a first harmonic rejection mixer, and a second harmonic rejection mixer. Each of the harmonic rejection mixers comprises a vector of mixer unit cells wherein each mixer unit cell comprises a differential input, transconductance elements connected to the corresponding differential input, and a switching network arranged to switch signals from the transconductance elements to a differential output, and the first and the second harmonic rejection mixers have mutual quadrature phase relationship. The first and the second rejection mixer share a plurality of mixer unit cells among the mixer unit cells of the vector, wherein each shared mixer unit cell comprises an input for receiving a signal to be mixed, an input for receiving control signals derived from a local oscillator signal, and one output for each of the first and second harmonic rejection mixers. The shared mixer unit cells are arranged to also employ a high impedance state.

The mixer arrangement may further comprise a third harmonic rejection mixer, and a fourth harmonic rejection mixer, wherein the third and the fourth rejection mixer share a second mixer unit cell comprising an input for receiving a signal to be mixed, an input for receiving control signals derived from a local oscillator signal, and one output for each of the third and fourth harmonic rejection mixers such that the mixer arrangement form a complex mixer.

The arrangement may further comprise a signal generation unit arranged to generate the control signals. The signal generation unit may be arranged to provide a first set of binary control signals associated with polarity switching for respective output of the shared mixer unit cell, and provide a second set of binary control signals associated with current output for respective output of the shared mixer unit cell such that current at any time instant is output to only one of the respective outputs. At least two mixer unit cells may be paired such that mixer unit cells of the pair cancel each other to produce a zero aggregate output such that all mixer unit cells are always active. Transconductances of each of the harmonic rejection mixers may be assigned by their mixer unit cells such that transconductances sum up to provide resemblance to a sinusoidal waveform. For any of the shared mixer unit cells, the input for receiving a signal to be mixed may comprise a differential input comprising a first and a second input terminal, wherein the signal at respective input terminal is subject to a transconductance and switched to alternatively a first and a second output terminal of a differential output associated with one of the sharing harmonic rejection mixers such that the signal from the first input terminal is coupled to the first output terminal thereof when the signal from the second input terminal is coupled to the second output terminal thereof and the signal from the first input terminal is coupled to the second output terminal thereof when the signal from the second input terminal is coupled to the first output terminal thereof, and switched to alternatively a first and a second output terminal of a differential output associated with another of the sharing harmonic rejection mixers such that the signal from the first input terminal is coupled to the first output terminal thereof when the signal from the second input terminal is coupled to the second output terminal thereof and the signal from the first input terminal is coupled to the second output terminal thereof when the signal from the second input terminal is coupled to the first output terminal thereof, and wherein the alternating switching for respective harmonic rejection mixer is controlled based on a signal derived from the first and second sets of control signals. For any of the shared mixer unit cells, the input for receiving a signal to be mixed may comprise a differential input comprising a first and a second input terminal, wherein the signal at respective input terminal is subject to a transconductance and switched to alternatively a first and a second node such that the signal from the first input terminal is coupled to the first node when the signal from the second input terminal is coupled to the second node and the signal from the first input terminal is coupled to the second node when the signal from the second input terminal is coupled to the first node, and the signal at the first node is switched to alternatively a first output terminal of a differential output associated with one of the sharing harmonic rejection mixers and a first output terminal of a differential output associated with another of the sharing harmonic rejection mixers and the signal at the second node is switched to alternatively a second output terminal of a differential output associated with one of the sharing harmonic rejection mixers and a second output terminal of a differential output associated with another of the sharing harmonic rejection mixers, and wherein the alternating switching for respective node is controlled based on a respective signal derived from the first and second sets of control signals and the alternating switching to respective output terminals of the sharing harmonic rejection mixers is controlled based on the second set of control signals. The mixer arrangement may comprise a first plurality of mixer unit cells and a second plurality of harmonic rejection mixers, wherein for one or more operation states some of the mixer unit cells are not in operation, and the second set of control signals also includes the high-impedance state for disabling one or more of the mixer unit cells not in operation.

Each harmonic rejection mixer may comprise an odd number of mixer unit cells.

The mixer unit cells may comprise switches switched in dependence on the control signals and arranged to selectively thereupon connect the signal from input to output of respective mixer unit cell. Each mixer unit cell may comprise a switch controller arranged to receive the control signals and provide control of switch operation of the switches of respective mixer unit cell based on the received control signals.

All mixer unit cells, respectively, may be structurally equally configured.

According to a second aspect, there is provided a radio circuit comprising a mixer arrangement according to the first aspect.

According to a third aspect, there is provided a communication apparatus comprising a radio circuit according to the second aspect.

Other objectives, features and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

For the understanding of the features of this disclosure and their benefits, an example of a double conversion receiver for reception of two carriers is used herein. However, as will be understood from the disclosure as a whole, the invention is not limited to this example. Instead, the features and benefits thereof can be employed to reduce consumption of circuit area and the from that caused issues for any mixer arrangement using harmonic rejection mixers. As also will be understood from the disclosure as a whole, benefits are also gained in sense of improvements in structured design of such arrangements.

Figure 1:
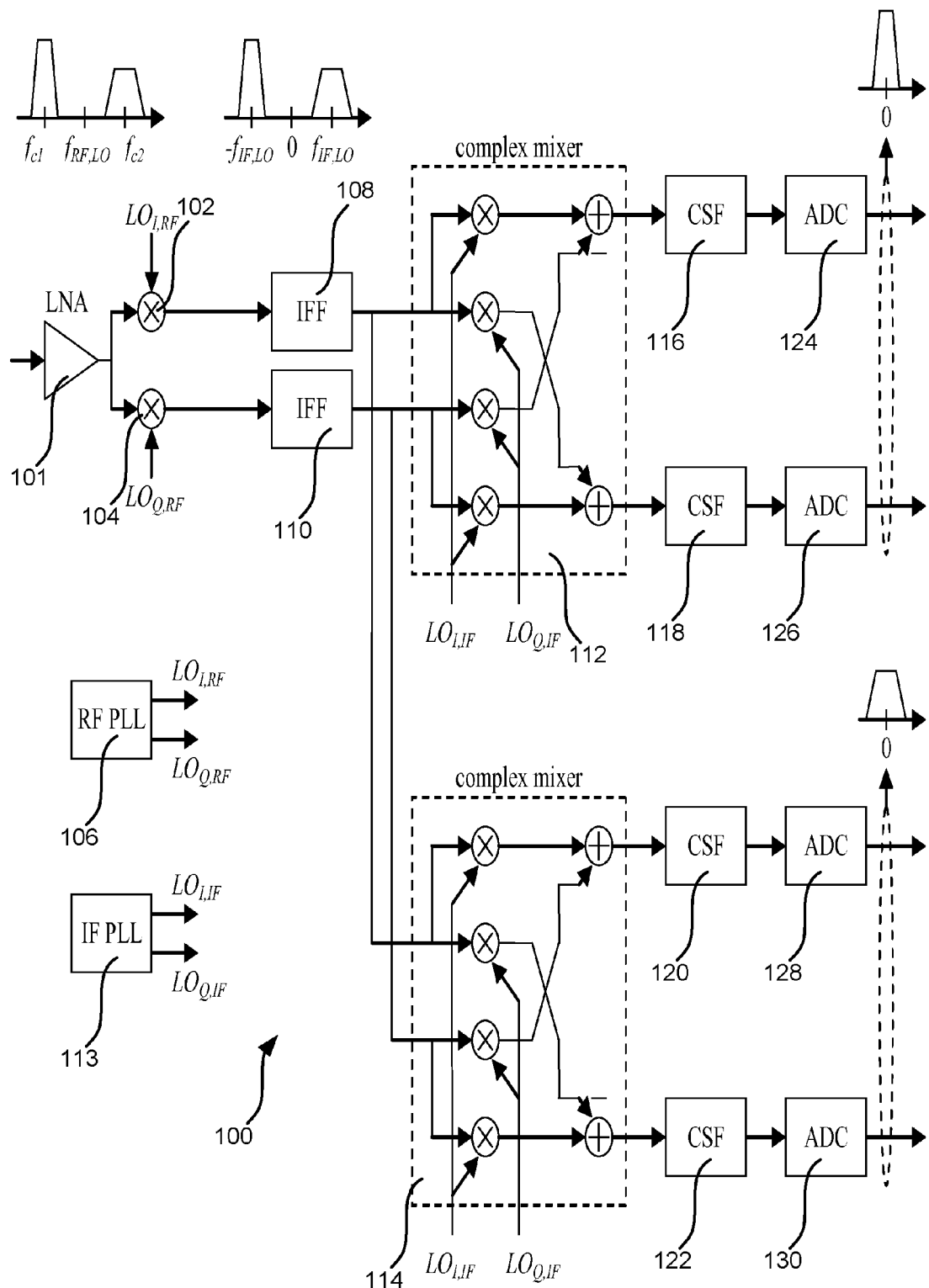
FIG. 1 illustrates an example of a mixer arrangement suitable for dealing with two carrier frequencies.

In a double-conversion receiver, a radio frequency (RF) signal is translated in two steps. When two carriers or two bands of carriers are received, and they are sufficiently close in frequency to enable down-conversion of them both using a single RF down-converter, they can be down-converted in a first step, and then in a second step they are simultaneously further down-converted and separated. FIG. 1 illustrates an example of a mixer arrangement suitable for dealing with two carrier frequencies. At top of FIG. 1, it is also illustrated, from left to right, frequency diagrams for the received carriers or bands of carriers, the down-converted carriers or bands of carriers after the first down-conversion step, and finally the further down-converted and separated carriers or bands of carriers.

The complex IF mixers preferably exhibit a substantial amount of harmonic rejection, otherwise undesired signals present around the harmonics of the IF LO frequency will be frequency-translated to fall on the desired signal. In other words, this provides issues for the use of traditional switched mixers that exhibit high conversion gain at harmonics of the LO, and at odd harmonics in particular. Furthermore, it may be possible to use time-discrete harmonic rejection mixers that provide a high degree of harmonic rejection up to a certain harmonic index beyond which LO sampling images are present. A pre-filter can be used to attenuate signals appearing around those frequencies.

As indicated in the FIG. 1, the RF signals consist of two carriers being proximate in frequency, located at $f_{c1}$ and $f_{c2}$, respectively. The frequency of the first LO signal driving the RF quadrature demodulator (RFLO) is set to a frequency, $f_{RF,LO}$, at the middle of the two carriers.

The two carriers can be down-converted to an IF frequency equal to half the carrier separation, $f_{IF,LO}$. The complex output of the quadrature demodulator makes it possible to distinguish the two carriers from each other as they will be located on either side of zero frequency, i.e. direct current (DC). At this point selectivity can be implemented by IF filters, e.g. low-pass or band-pass filters to reduce signals levels at LO sampling image frequencies but also to reduce blocking signals to alleviate dynamic range requirements downstream in the receiver.

The second conversion step is performed by complex IF mixers that aims to separate the two carriers while also down-converting them to baseband. This down-conversion is feasible by a second LO with a frequency set to $f_{IF,LO}$. Ideally, we might consider the complex-valued IF signal at the input to be represented by $$s_{IF} = m_1 \cdot e^{j2\pi(f_{c1}-f_{RF,LO})t} + m_2 \cdot e^{j2\pi(f_{c1}-f_{RF,LO})t} = m_1 \cdot e^{j2\pi f_{IF,LO}t} + m_2 \cdot e^{j2\pi f_{IF,LO}t} \quad \text{(eq. 1)}$$

, where $m_1$ and $m_2$ represent the complex-valued modulation of first and second carrier, respectively.

The purpose of the IF mixers is to multiply this input signal by two phases, $e^{-j2\pi f_{IF,LO}t}$ and $e^{j2\pi f_{IF,LO}t}$, yielding two complex-valued baseband signals, $$s_1 = e^{j2\pi f_{IF,LO}t}(m_1 \cdot e^{-j2\pi f_{IF,LO}t} + m_2 \cdot e^{j2\pi f_{IF,LO}t}) = m_1 + m_2 \cdot e^{j4\pi f_{IF,LO}t} \quad \text{(eq. 2)}$$

$$s_2 = e^{-j2\pi f_{IF,LO}t}(m_1 \cdot e^{-j2\pi f_{IF,LO}t} + m_2 \cdot e^{j2\pi f_{IF,LO}t}) = m_1 \cdot e^{j4\pi f_{IF,LO}t} + m_2 \quad \text{(eq. 3)}$$

where the components at double the IF LO frequency are assumed to be removed by the remaining selectivity of the receiver.

In the given example, a complex intermediate frequency (IF) based architecture is illustrated. The arrangement 100 comprises a first set of mixers 102, 104 receiving the RF signal from a low-noise amplifier, LNA, 101, wherein the mixers 102, 104 are arranged mutually in quadrature by phase offset of local oscillator (LO) signals $LO_{I,RF}$, $LO_{Q,RF}$ provided to the mixers 102, 104. The LO signals $LO_{I,RF}$, $LO_{Q,RF}$ are provided by a LO 106 which provides the LO signals at a frequency $f_{RF,LO}$ that is between the frequencies $f_{c1}$, $f_{c2}$ of the two carriers or bands of carriers. The mixers 102, 104 outputs the IF signal as an in-phase IF signal and a quadrature-phase IF signal. These signals are preferably filtered by IF signal filters 108, 110, and then provided to a respective complex mixer 112, 114 for the respective carrier or band of carriers. The complex mixers 112, 114 performs the second down-conversion step using another LO signal $LO_{I,IF}$, $LO_{Q,IF}$ provided from another LO 113, and the signals are preferably then filtered by channel selection filters 116, 118, 120, 122, and then digitised by analog-to-digital converters 124, 126, 128, 130. Further processing in digital domain (not shown) can then be made.

The complex mixers 112, 114 of the arrangement 100 should preferably provide a substantial amount of harmonic rejection. Otherwise will undesired signals be present around harmonics of the frequency of the another LO such that they are frequency-translated to fall on the desired signal. This is troublesome since it is for a number of other reasons preferred to use switched mixers for the second mixing step. However, such switched mixers will provide high conversion gain at harmonics of the another LO and at odd harmonics in particular. Using time-discrete harmonic rejection mixers and/or using a pre-filter to attenuate signals around those frequencies may alleviate the problem.

Figure 2:
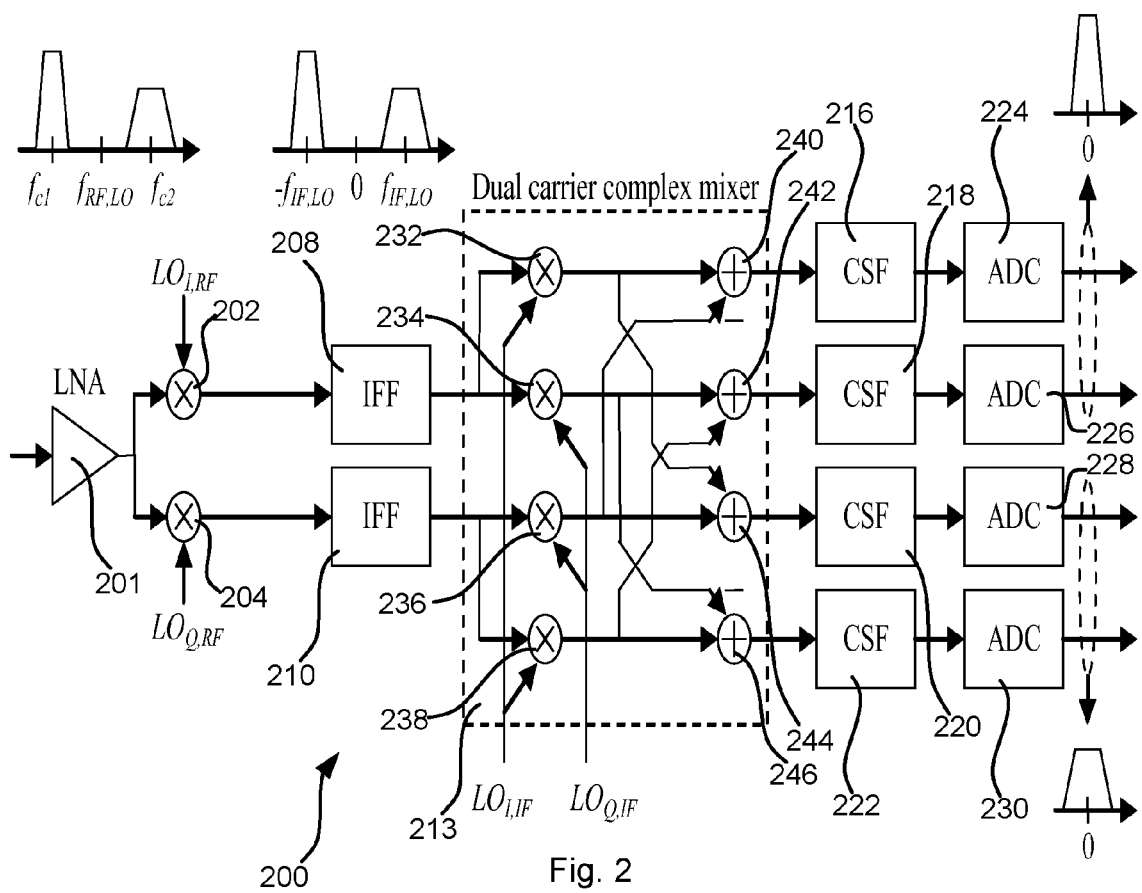
FIG. 2 illustrates another example of a mixer arrangement suitable for dealing with two carrier frequencies.

FIG. 2 illustrates another example of a mixer arrangement 200 suitable for dealing with two carrier frequencies. An LNA 201 provides an RF signal to mixers 202, 204 arranged mutually in quadrature by phase offset of local oscillator (LO) signals $LO_{I,RF}$, $LO_{Q,RF}$ provided to the mixers 202, 204. Similar to the example given with reference to FIG. 1, complex IF signals are generated accordingly and the IF signals are filtered by IF signal filters 208, 210, and then provided to a dual carrier complex mixer 213. The dual carrier complex mixer 213 performs the second down-conversion step using another LO signal $LO_{I,IF}$, $LO_{Q,IF}$ provided from another LO and the signals are preferably then filtered by channel selection filters 216, 218, 220, 222, and then digitised by analog-to-digital converters 224, 226, 228, 230. Further processing in digital domain (not shown) can then be made. The dual carrier complex mixer 213 comprises mixer elements 232, 234, 236, 238 fed by respective of the in-phase and quadrature IF signals, and the LO signals $LO_{I,IF}$, $LO_{Q,IF}$, and summing elements 240, 242, 244, 246, wherein each mixer element 232, 234, 236, 238 provides the output signal to two of the summing elements 240, 242, 244, 246, wherein output signals from mixer elements 234, 236, which are mixing by the quadrature LO signal $LO_{Q,IF}$, are connected to summing elements 240, 246 so as to provide inverse sign in the summing.

Figure 3:
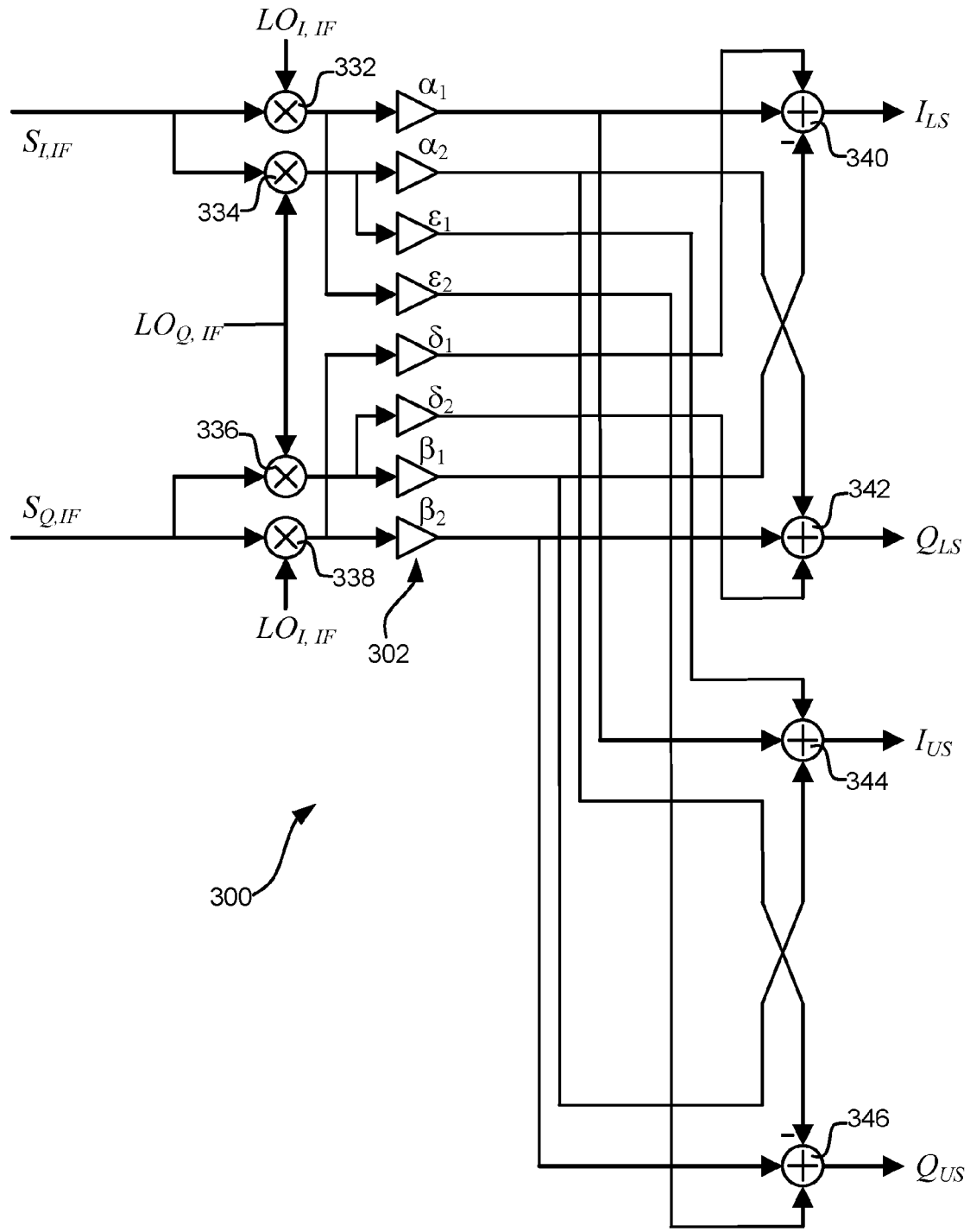
FIG. 3 illustrates further an example of a mixer arrangement suitable for dealing with two carrier frequencies, where controllable gain elements are used to compensate for mixer imbalance.

A dual carrier complex mixer 300 can include means 302 for calibration of RF mixer imbalance, as illustrated in FIG. 3. Each mixer element 332, 334, 336, 338 can provide its output to three summing elements 340, 342, 344, 346, i.e. each summing element has three inputs. The benefit is the improved imbalance calibration, but at the cost of increased circuitry.

Figure 4:
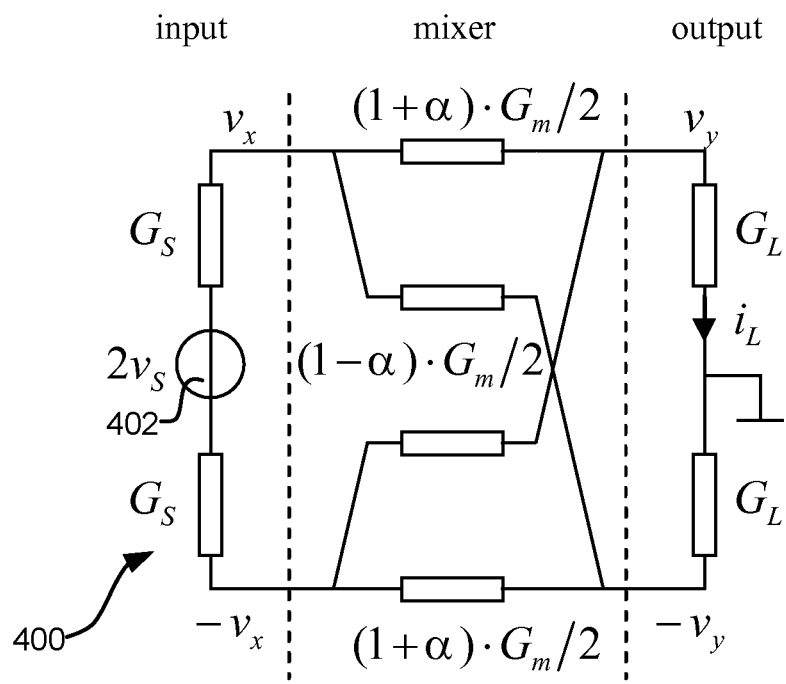
FIG. 4 illustrates an equivalent circuit for a harmonic rejection mixer.

For the further understanding of harmonic rejection mixers, FIG. 4 illustrates an equivalent circuit 400 for a harmonic rejection mixer. The equivalent circuit 400 comprises a voltage source 402 which drives a resistive voltage-to-current conversion with single-ended transconductance, i.e. gain, given by $$g_m = \alpha G_m \quad \text{(eq. 4)},$$

where $\alpha=\cos(2\pi f_{IF,LO}t)$ to represent $LO_{I,IF}$ and $\alpha=\sin(2\pi f_{LI,LO}t)$ to represent $LO_{Q,IF}$, for high load and source conductances $G_L$ and $G_S$, and the circumstance demonstrated below and in equation 5.

The cross-coupled structure ensures that the input and output conductance of the mixer is constant with a variable a, as long as the load and source conductances, respectively, fulfil $$G_L G_S >> G_m^2 \qquad \text{(eq. 5)}$$

Figure 5:
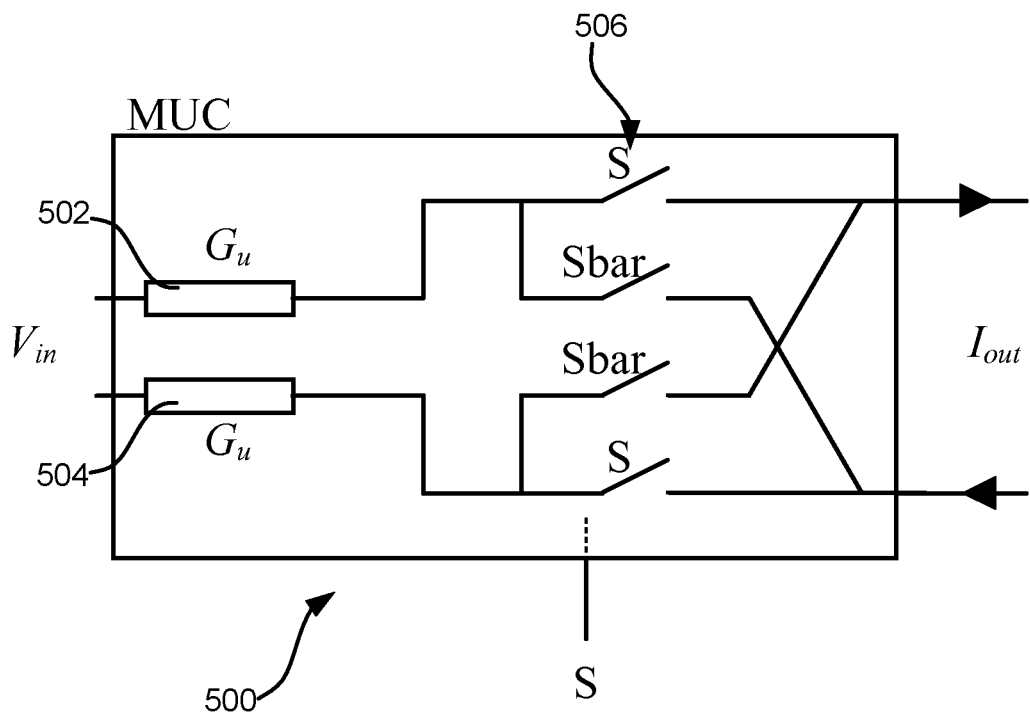
FIG. 5 illustrates a mixer unit cell.

A harmonic rejection mixer with time-continuous operation according to what is demonstrated above is not recommendable with regards to implementation in commercially feasible products. Instead, a time-discrete solution based on the use of a mixer unit cell 500, as depicted in FIG. 5, that includes a pair of resistors 502, 504 with resistance $R_u$, where $R_u=1/G_u$, together with a sign-switching network 506, i.e. a switching network arranged to select polarity of a signal towards the output, controlled by signals S and Sbar, where Sbar is the logical inverse of S.

Figure 6:
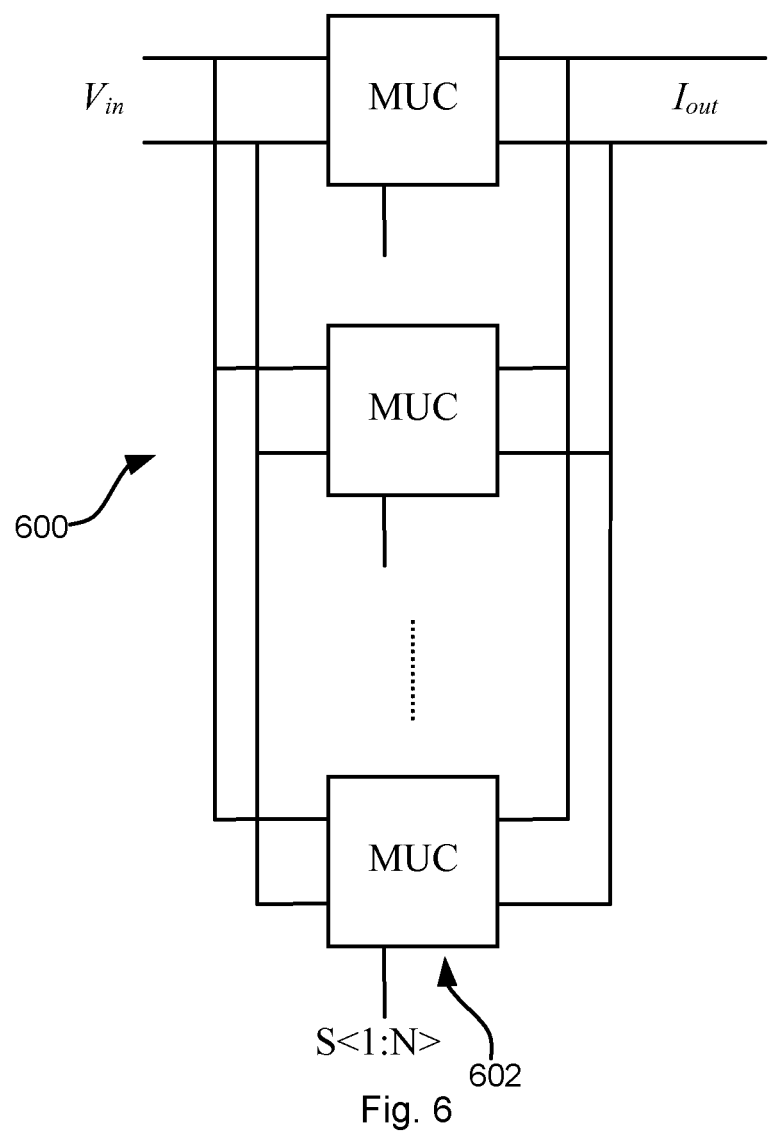
FIG. 6 illustrates a mixer formed from mixer unit cells.

A vector 600 of N unit cells 602 are connected in parallel, as depicted in FIG. 6, and switches of the sign-switching networks are controlled to generate a time-discrete sinusoidal resembling transconductance. That is, the effective LO waveform is represented by a thermometer code S<1:N>, where S can take values 0 or 1 for achieving the thermometer code such that the single-ended transconductance becomes $$g_m = G_u \sum_{k=1}^{N} (S(k) - Sbar(k)) \qquad \text{(eq. 6)}$$

These control sequences can be provided by a digital sequencer to produce a sinusoidal resembling transconductance.

The discretisation into N unit cells means that the samples of the sinusoidal transconductance will be quantised such that $$g_m \in [-NG_u - (N-2)G_u \ldots (N-2)G_u NG_u] \qquad \text{(eq. 7)}$$

It is possible to use a very limited number of unit cells and yet obtain very low levels of quantization. This can be achieved by using an integer number of samples per LO period and use the number of unit cells for max $g_m$ that leads to the highest spectral purity, i.e. minimised harmonic content and therefore maximised harmonic rejection.

Figures 7, 13:
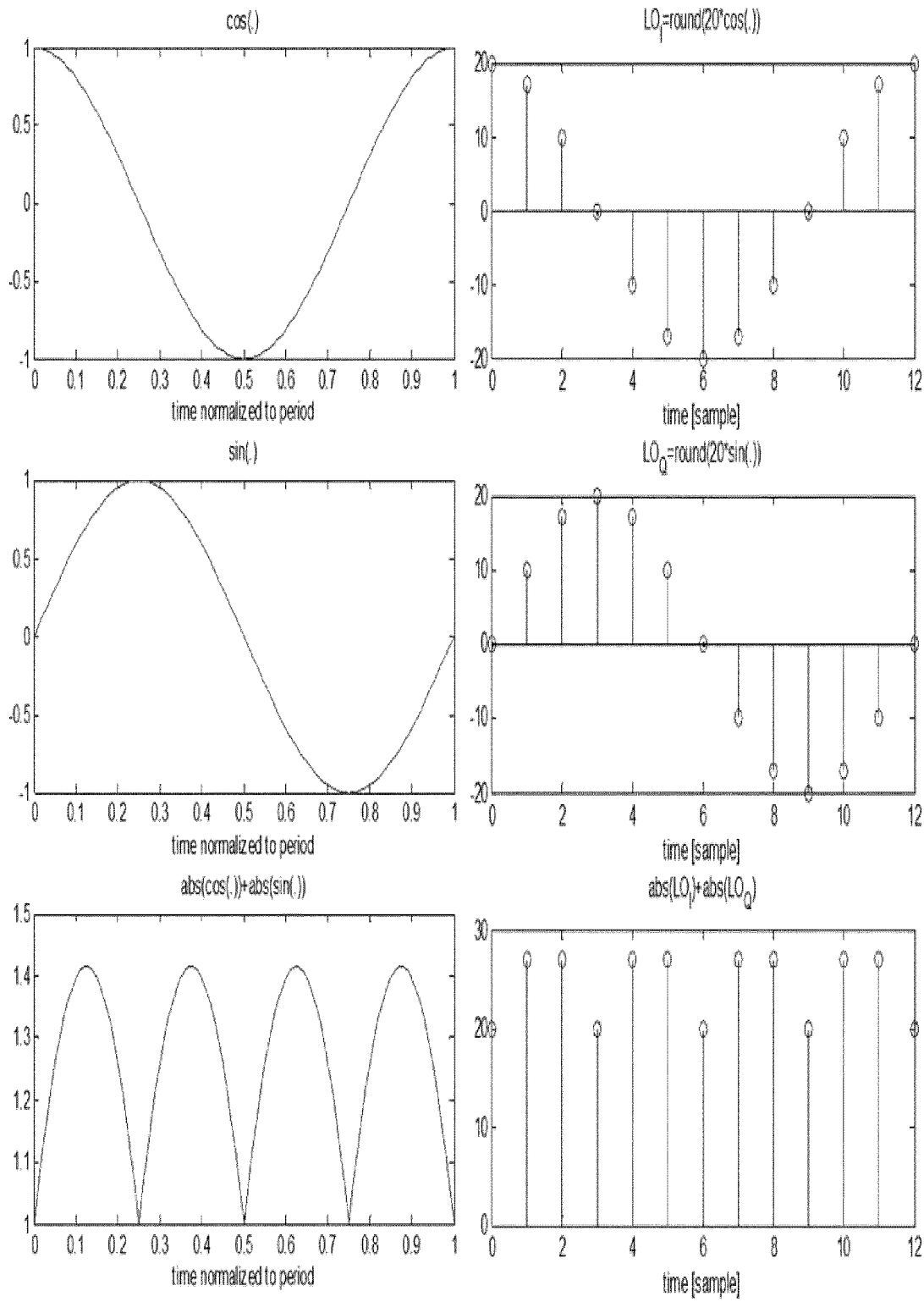
FIG. 7 illustrates graphs of time-continuous sine and cosine waveforms, and their absolute value sum.
FIG. 13 illustrates graphs of time-discrete sine and cosine waveforms, and their absolute value sum.

Coming to this point, the circuit area, e.g. for integrated circuits, consumption is non-negligible. When saving area by using four harmonic rejection mixers for reception of two carriers, the supporting circuitry required becomes large, i.e. each mixer may need a following buffer since it provides its output to three summing elements and a distribution network may consume space, although it adds benefits in terms of calibration of individual paths. Here, when the mixer has a current output, accurate current splitting may not be guaranteed by just forwarding that current to three different current summing nodes. Having a buffer with virtual ground input and a voltage output which drives three resistive networks to generate three currents to the three different current summing nodes can solve this. However, in a solution with separate complex mixers, each harmonic rejection mixer do not need to distribute its signal to more than one summing node, except for any issue about the calibration. When using eight harmonic rejection mixers, i.e. one complex IF mixer for each carrier, the area can be made smaller if the buffers and associated circuitry can be omitted, i.e. at the expense of lost means for calibration, but the harmonic rejection mixer area will nevertheless double in size. Thus, the next task is to reduce layout area of the complex harmonic rejection mixer regardless of the IF mixer architecture being used. This is achieved by reuse of mixer unit cells between two harmonic rejection mixers operating in mutual quadrature. While the peak transconductance value of one of the harmonic rejection mixers will be $NG_u$, the peak of the absolute sum of the two harmonic rejection mixers will be approximately $\sqrt{2}NG_u$. This provides for a reduction of about 33% compared to if the two harmonic rejection mixers were operated independently. This can be seen from FIG. 7 which shows (from top to bottom) cosine and sine waveforms, and also the sum of their absolute values. Next to FIG. 7, FIG. 13 illustrates for comparison corresponding time-discrete case, which will be further elucidated below.

Mixer unit cells that is not used for in-phase harmonic rejection mixer can in part or completely be handed over to a quadrature phase harmonic rejection mixer as required, and vice versa. Input and output impedance of the complex IF mixer will not be affected since each node is attached to one in-phase mixer and one quadrature-phase mixer. Thus, the total impedance will be constant.

The above demonstrated mixer unit cell sharing can be employed for example for the architectures discussed with reference to FIG. 1 or FIG. 2. The mixer unit cell sharing can also be used in quadrature up and down conversion mixers if input and output impedance changes are managed.

Figure 8:
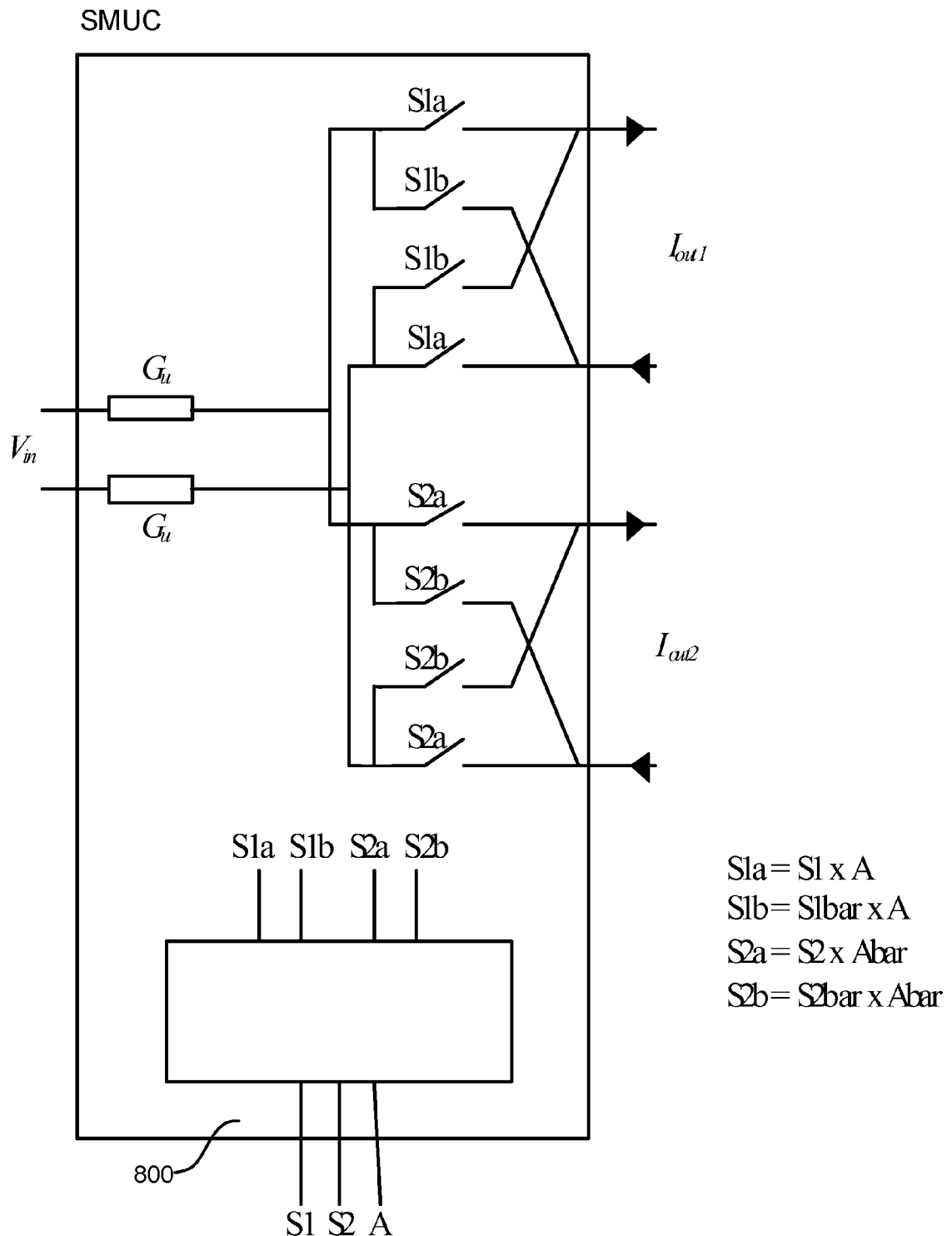
FIG. 8 illustrates a mixer unit cell suitable for mixer unit cell sharing according to an embodiment

FIG. 8 schematically illustrates a shared mixer unit cell, SMUC, 800 according to an embodiment. The SMUC 800 has an input where the signal $V_{in}$ is provided through transconductances $G_u$ to a sign switching network, i.e. a switching network arranged to select polarity of a signal towards the output. In addition to providing sign control as for a regular mixer unit cell, e.g. as demonstrated with reference to FIG. 5, output current is now output to one of two output ports, but never to both simultaneously. Here, both ports have the switches located on the output side. The outputs can be terminated with low impedances, e.g. virtual ground, which will have the least impact on voltage modulation on the switches. If this is not a concern, the SMUC can have the switches on the input side with two input signal voltages to alternate between and one current output.

Sign switching control signals S1 and S2 for respective ports are provided to the SMUC 800. An arbitration signal A also provided to the SMUC 800 will ensure that the current is not output to both the output ports simultaneously by the relations $S1a = S1 \times A$ $S1b = S1bar \times A$ $S2a = S2 \times Abar$ $S2b = S2bar \times Abar$, where the respective switches are controlled by SMUC internal control signals S1a, S1b, S2a, S2b generated from control signals S1, S2, A, where S1bar denotes logical inverse of S1, S2 bar denotes logical inverse of S2, and Abar denotes logical inverse of A. In the illustration of FIG. 8, it is depicted that control signals S1, S2 and A are provided from a sequencer and internal control signals S1a, S1b, S2a and S2b are generated therefrom in the SMUC 800. However, the control signals S1a, S1b, S2a and S2b can of course also be provided directly from the sequencer. Further, the provision of the control signals from the sequencer to the SMUC can be affected by latency and/or other effects on the control signals. In such cases, local flip-flops may be employed in or close to the SMUC 800 to synchronise all SMUCs with a common phase of a clock, wherein the generation of the respective physical control signals for the switches are generated accordingly anyway. A reduced number of signals can thus be preferred to be conveyed between the sequencer and the SMUC 800.

Figure 9:
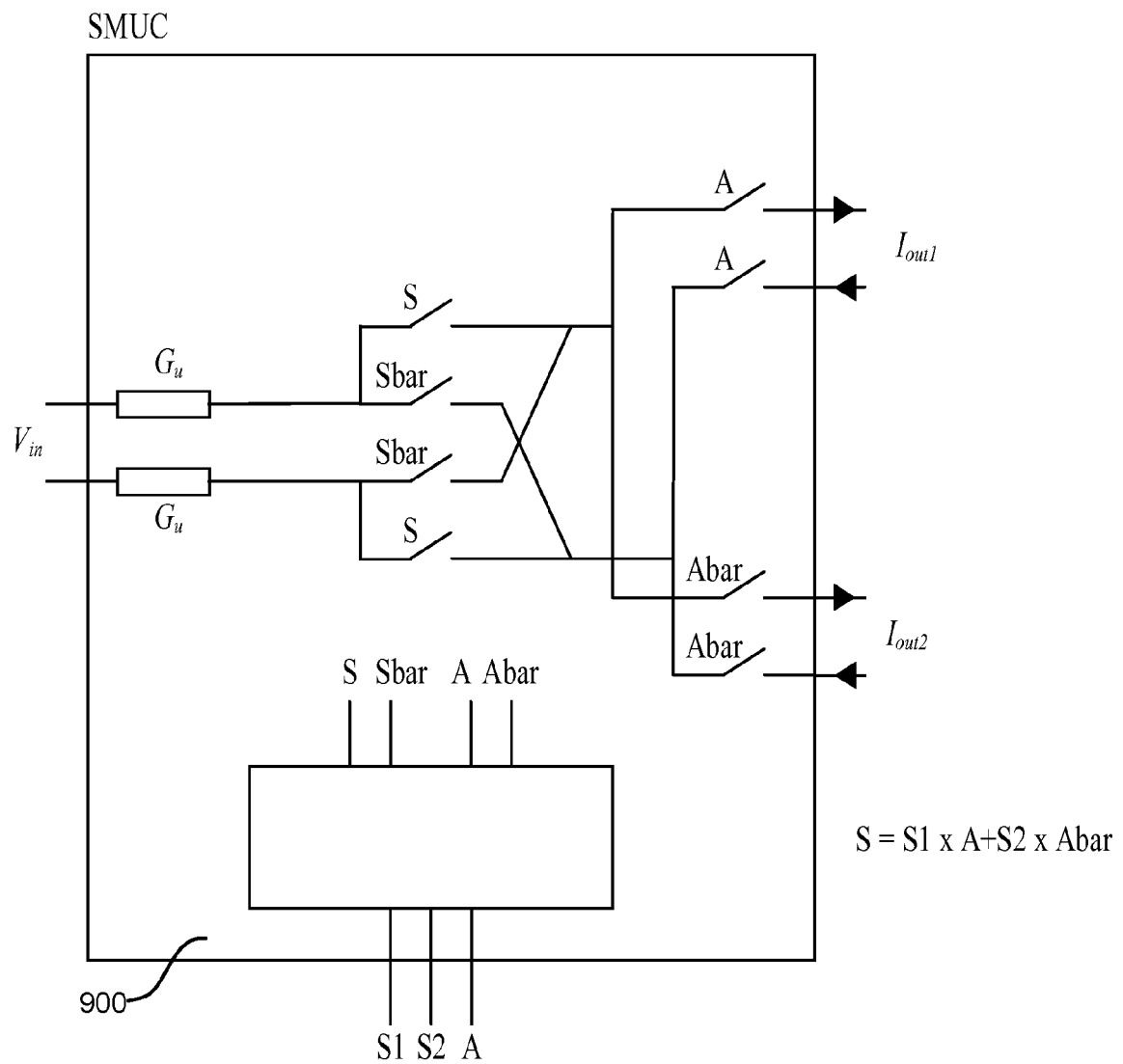
FIG. 9 illustrates a mixer unit cell suitable for mixer unit cell sharing according to an embodiment.

FIG. 9 schematically illustrates a SMUC 900 according to an embodiment. The SMUC 900 has an input where the signal $V_{in}$ is provided through transconductances $G_u$ to a sign switching network, i.e. a switching network arranged to select polarity of a signal towards the output. Here, the sign switching network includes a sequential signal and path control. For comparison with the SMUC 800 demonstrated with reference to FIG. 8, the control signals into the SMUC 900 are the same, i.e. S1, S2, A. However, according to the discussion above, the sequencer can of course provide control signals S and A directly. The relation between S1 and S2 and S is, where the addition of "bar" also here means the logical inverse, S=S1×A+S2×Abar.

Figure 10:
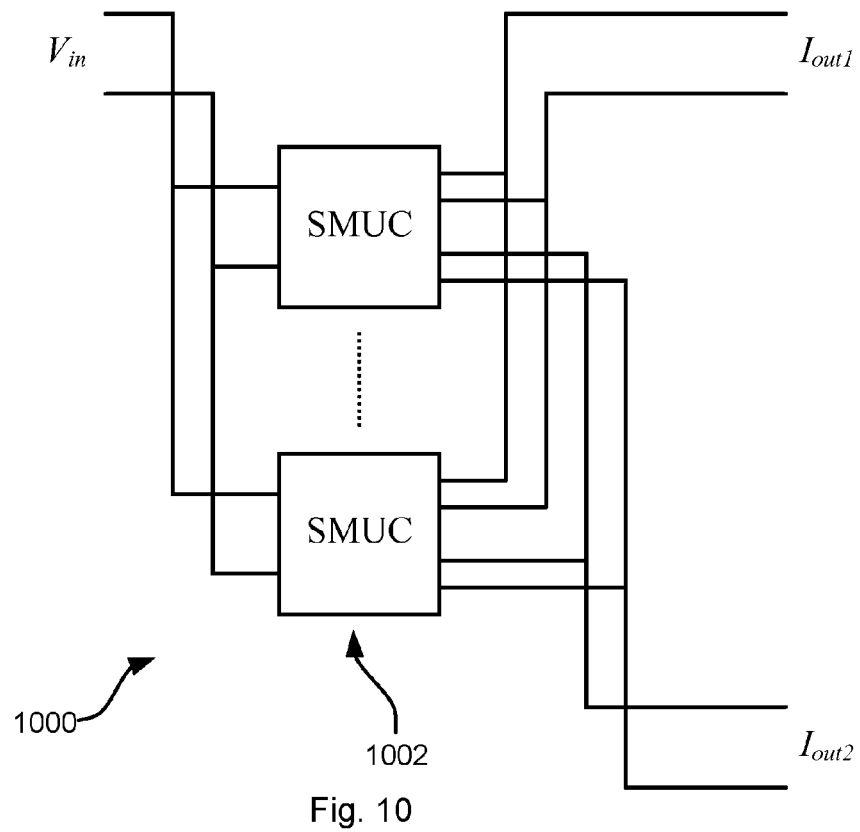
FIG. 10 illustrates a mixer arrangement comprising two harmonic rejection mixers using shared mixer unit cells.

FIG. 10 illustrates a mixer arrangement 1000 comprising at least two harmonic rejection mixers using shared mixer unit cells 1002. Here, according to the illustration, all mixer unit cells are shared, which is of course not necessary as will be demonstrated with reference to FIG. 11 below. The thermometer code as demonstrated above for providing the sign switching signal to the respective SMUCs can be employed and can be provided by a sequencer (not shown), which preferably is controlled by one or more LOs. Locally clocked flip-flops can be provided in the SMUCs or by any circuitry in vicinity of them for each signal controlling a switch, respectively, if necessary to synchronise all SMUCs with a common phase of a clock due to the architecture of the mixer arrangement and/or other circuitry.

An advantage of having all mixer unit cells shared is that a regular layout structure can be achieved, but which can be at the expense of longer signal routes for some output lines of the mixer arrangement 1000.

Figure 11:
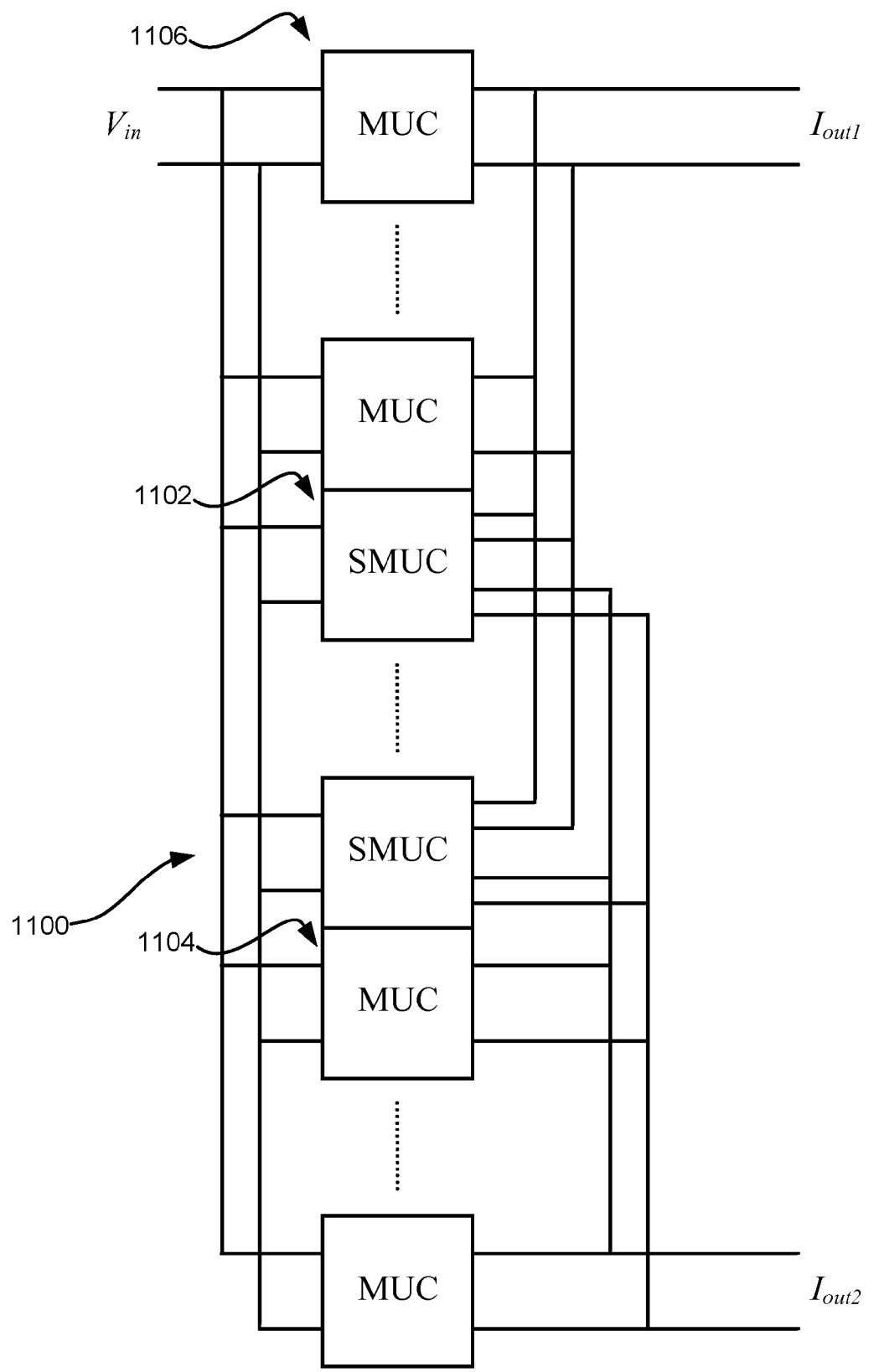
FIG. 11 illustrates a mixer arrangement comprising two harmonic rejection mixers using both shared and non-shared mixer unit cells.

FIG. 11 illustrates a mixer arrangement 1100 comprising at least two harmonic rejection mixers using both shared 1102 and non-shared 1104, 1106 mixer unit cells. The principles for this mixer arrangement 1100 are similar to what has been demonstrated above in sense of thermometer code, local flip-flops, assignment of switches, etc.

An advantage of having a mix of shared and non-shared mixer unit cells can be that a design with comparably shorter signal routes for the outputs can be achieved, but at the expense of a more irregular layout structure.

Figure 12:
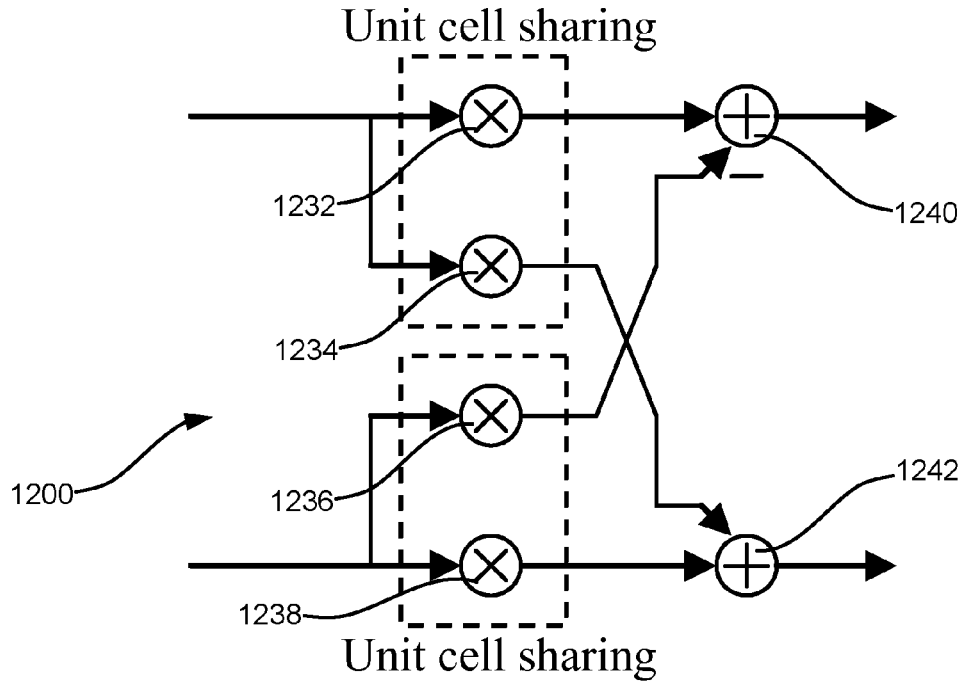
FIG. 12 illustrates a complex harmonic rejection mixer using shared mixer unit cells.

FIG. 12 illustrates an example of assignment of shared mixer unit cells in a complex harmonic rejection mixer 1200. For a complex harmonic rejection mixer, such as for example those demonstrated with reference to FIG. 1, there are four harmonic rejection mixers. The harmonic rejection mixer 1200 features four harmonic rejection mixers 1232, 1234, 1236, and 1238 and includes two summing elements 1240, 1242. For example, assigning the sharing can be such that the mixers having the in-phase IF signal as input to share SMUCs and that the mixers having the quadrature phase IF signal as input share their SMUCs. Thereby a lean circuitry can be provided. Similar advantage can be provided for a structure as those of the complex harmonic rejection mixers demonstrated with reference to any of FIGS. 2 and 3.

FIG. 13 illustrates graphs of time-discrete (from top to bottom) cosine and sine waveforms, and their absolute value sum. The graphs can be compared to the time-continuous graphs of FIG. 7 for finding correspondence (note the scales of level of sums). The illustrated time-discrete cosine and sine waveforms have an oversampling comprising 12 samples per LO period and are quantised to 20 amplitude levels, but this can of course be chosen differently. Here, the degree of oversampling can be chosen such that switching in mixer unit cells, in the chosen structure, works well. The number of amplitude levels chosen has a relation to the number N of mixer unit cells used, i.e. to correspond to thermometer code. However, it will be discussed below that the quantisation can raise some issues to be considered when designing the mixer arrangement.

In the depicted example, the maximum of the sum is 28. Depending on the chosen number of samples per LO period and the quantisation of the amplitude level, the maximum sum of the absolute values of quantised amplitude levels may due to quantisation and sample position give a value exceeding a theoretical maximum level calculated based on time-continuous summed absolute values. Thus, one or two mixer unit cells more than such theoretical maximum level may be needed to be assigned when applying the thermometer code. The opposite will also be possible.

Thus, a single harmonic rejection mixer needs N control signals S<1:N>, from which Sbar <1:N> can be derived. A first and a second harmonic rejection mixer would thus need 2N control signals. When the first and the second harmonic rejection mixer shares P mixer unit cells, there is further needed P control signals A<1:P>, from which Abar <1:P> can be derived, to control whether the signal should be output to a first or second output of the SMUC, i.e. to be associated to the first or the second harmonic rejection mixer.

For a case where not all SMUCs are active, i.e. not being assigned to either the first or the second harmonic rejection mixer, a third state of the SMUC can be employed, e.g. a high impedance state, wherein for example redundant mixer unit cells which can be used for matching purposes etc. can be kept in reserve.

Figure 14:
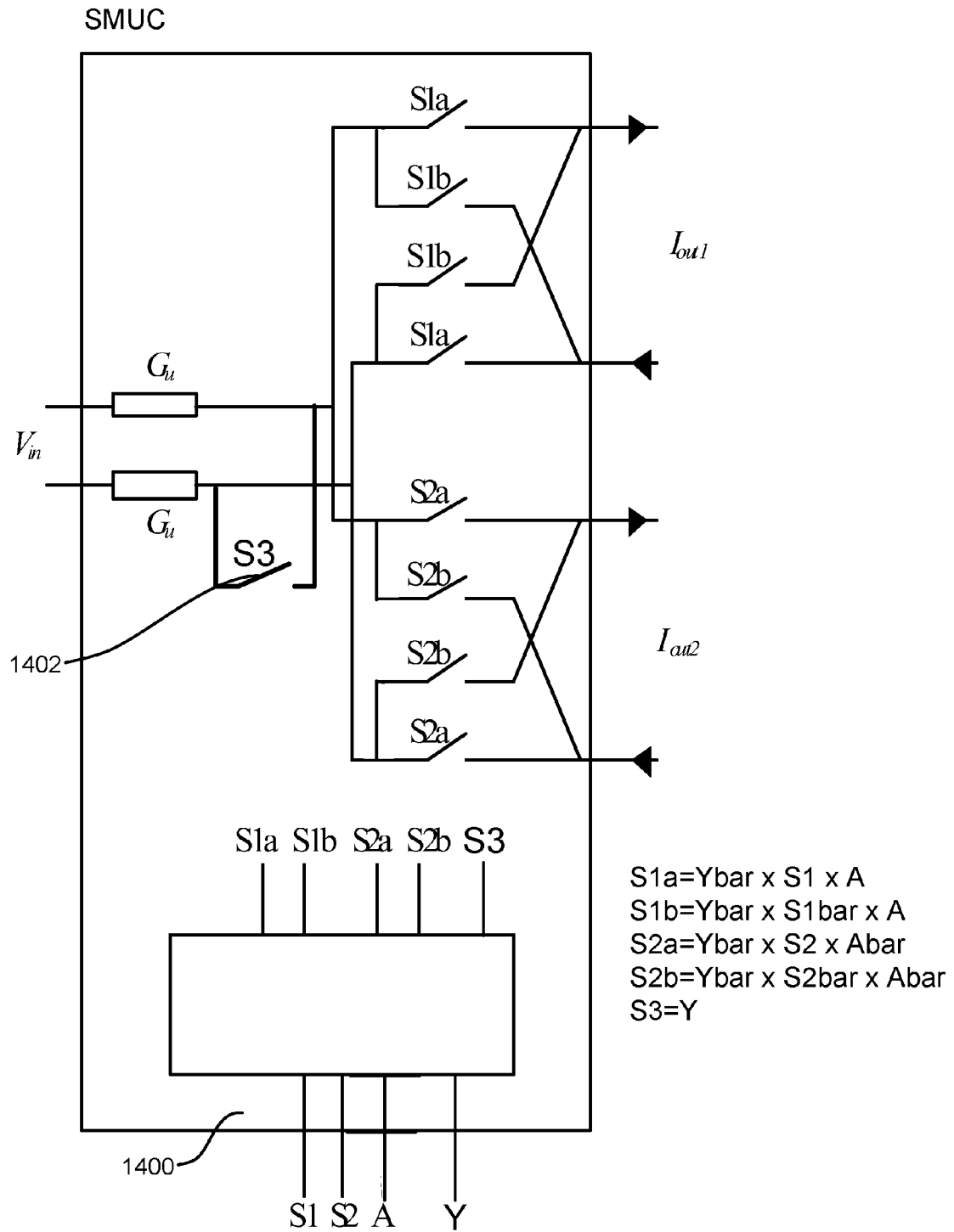
FIG. 14 illustrates a mixer unit cell suitable for mixer unit cell sharing according to an embodiment

FIG. 14 schematically illustrates a shared mixer unit cell, SMUC, 1400 according to an embodiment implementing such third state. The SMUC 1400 has an architecture similar to the one demonstrated with reference to FIG. 8, but can also include a switch 1402 for short circuit of internal nodes to avoid a differential charge to build up when internal nodes are not connected to any output terminal, as will be understood to occur from the description below of control signals S1a, S1b, S2a and S2b for the respective switches of the SMUC 1400. Further, an additional signal Y from the sequencer is provided, and the internal control signals for the switches are provided according to the relations $S1a = Y\text{bar} \times S1 \times A$ $S1b = Y\text{bar} \times S1\text{bar} \times A$ $S2a = Y\text{bar} \times S2 \times A\text{bar}$ $S2b = Y\text{bar} \times S2\text{bar} \times A\text{bar}$ $S3 = Y,$ where the respective switches are controlled by SMUC internal control signals S1a, S1b, S2a, S2b, S3 generated from control signals S1, S2, A and Y, where S1bar denotes logical inverse of S1, S2bar denotes logical inverse of S2, Abar denotes logical inverse of A, and Ybar denotes logical inverse of Y and x denotes logical AND operation. In the illustration of FIG. 14, it is depicted that control signals S1, S2, A and Y are provided from a sequencer and internal control signals S1a, S1b, S2a, S2b and S3 are generated therefrom in the SMUC 1400. However, the control signals S1a, S1b, S2a, S2b and S3 can of course also be provided directly from the sequencer. Further, the provision of the control signals from the sequencer to the SMUC can be affected by latency and/or other effects on the control signals. In such cases, flip-flops may be employed in or close to the SMUC 1400, wherein the generation of the physical control signals for the switches are generated accordingly anyway. A reduced number of signals can thus be preferred to be conveyed between the sequencer and the SMUC 1400. By the signal Y, the SMUC 1400 can thus be set in the third state, i.e. to functionally disconnect the SMUC by a high-impedance state.

Figure 15:
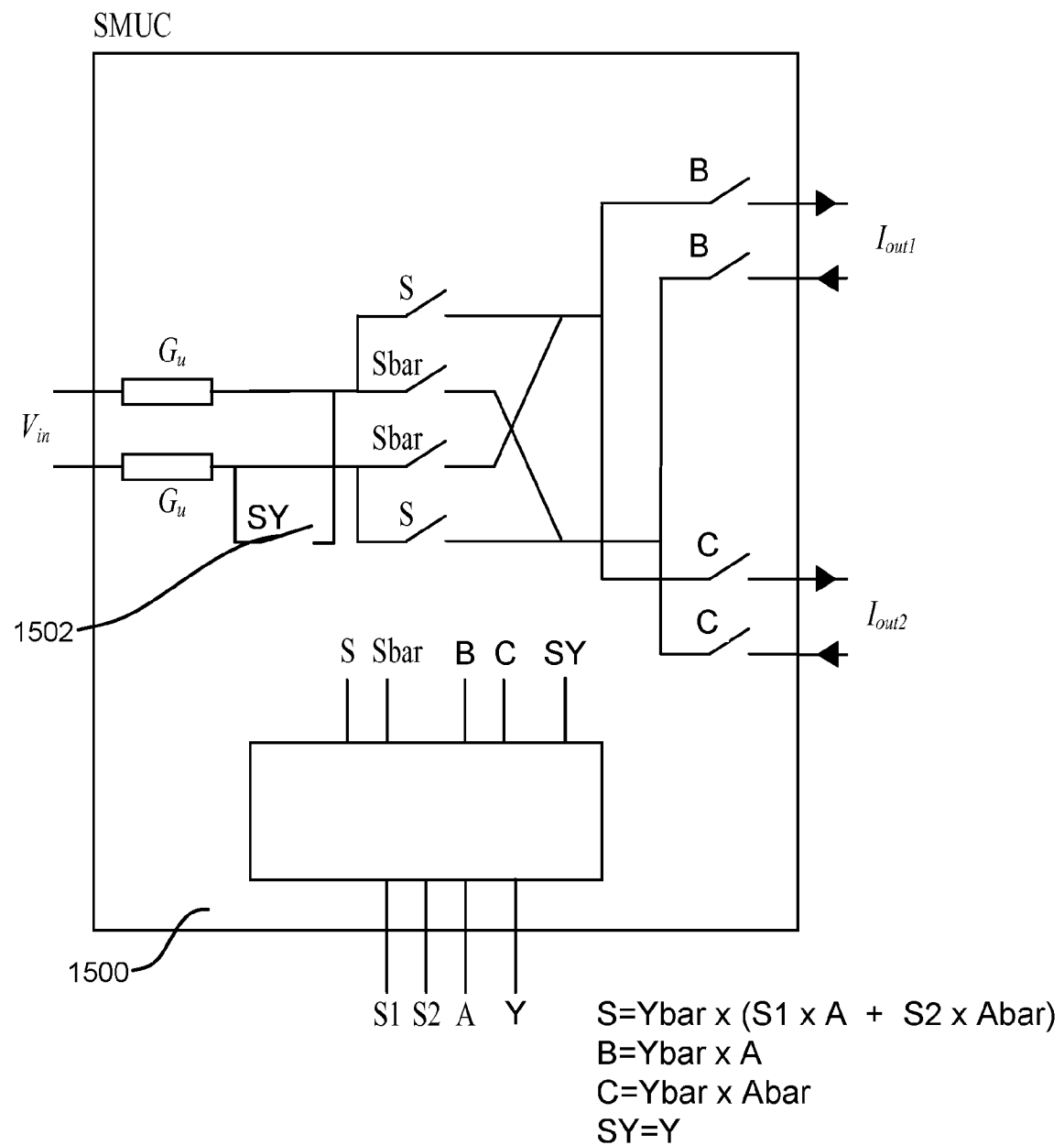
FIG. 15 illustrates a mixer unit cell suitable for mixer unit cell sharing according to an embodiment.

FIG. 15 schematically illustrates a SMUC 1500 according to an embodiment. The SMUC 1500 has an architecture similar to the one demonstrated with reference to FIG. 9, but can also include a switch 1502 for short circuit of internal nodes to avoid a differential charge to build up when internal nodes are not connected to any output terminal, as will be understood to occur from the description below of control signals B and C for the respective switches of the SMUC 1500. The SMUC 1500 has an input where the signal $V_{in}$ is provided through transconductances $G_u$ to a sign switching network, i.e. a switching network arranged to select polarity of a signal towards the output. Here, the sign switching network includes a sequential signal and path control. For comparison with the SMUC 1400 demonstrated with reference to FIG. 14, the control signals into the SMUC 1500 are the same, i.e. S1, S2, A and Y. However, according to the discussion above, the sequencer can of course provide control signals S, B, C and SY directly. The relations between S1, S2, A and Y and the control signals S, B, C and SY are $S=Y\text{bar}\times(S1\times A+S2\times A\text{bar})$ $B=Y\text{bar}\times A$ $C=Y\text{bar}\times A\text{bar}$ $SY=Y,$ where the addition of "bar" also here means the logical inverse.

By the signal Y, the SMUC 1500 can thus be set in the third state, i.e. to functionally disconnect the SMUC by a high-impedance state.

When each harmonic rejection mixer is set to represent a certain transconductance and the sum of a first and second harmonic rejection mixer transconductance may not sum up to the maximum transconductance available from all mixer unit cells. Then, the remaining mixer unit cells should be configured to produce zero transconductance. This can be achieved by letting pairs of mixer unit cells produce transconductances with opposite signs, i.e. polarity, to cancel each other. However, when unit cells are handed over from a first harmonic rejection mixer to a second harmonic rejection mixer, it is beneficial if they are handed over in pairs since a single mixer unit cell will always contribute with $+G_u$ or $-G_u$, if not provided with a third state as demonstrated above. By this pair handling, the number P of control signals for A can be reduced to P/2.

For a case where both the first and the second harmonic rejection mixer can have an odd number of mixer unit cells, accuracy can be improved since the number of transconductance levels can be doubled (cf. eq. 7)

$g_m\epsilon[-NG_u-(N-1)G_u\ldots(N-1)G_uNG_u]$ (eq. 8)

A particular advantage when having a SMUC capable of a third state, as demonstrated above, is when not both of a first and a second harmonic rejection mixer simultaneously benefits from an odd number of mixer unit cells. However, input and/or output impedance may in such cases vary a bit.

The principle for handover of mixer unit cell pairs configured to produce zero transconductance contribution, as discussed above, can be implemented in various ways. It may be based on that all such pairs are associated with either a first or a second harmonic rejection mixer; split equally between a first and second harmonic rejection mixer; or associated according to a random or more variable pattern. Ideally, handover of "unused" SMUC pairs will not have any impact on performance, but need to be considered anyway in a real implementation.

The invention has mainly been described above with reference to a few embodiments. From this disclosure it can be understood that considerable layout area savings can be done utilising the principles demonstrated above. As a further advantage, the smaller layout area needed also provides for shorter paths for clock signals and other signals with corresponding benefits as reduced power dissipation, latency, interference sensitivity, etc. In this disclosure, some implementations where the embodiments can be beneficial have been indicated. However, as is readily appreciated by a person skilled in the art, other embodiments and implementations than the ones disclosed above are equally possible within the scope of the invention, as defined by the appended patent claims.

The invention claimed is:

1. A mixer arrangement for complex signal mixing comprising:
    a first harmonic rejection mixer; and
    a second harmonic rejection mixer,
    wherein each of the harmonic rejection mixers comprises a plurality of mixer unit cells wherein each mixer unit cell comprises a differential input, transconductance elements connected to the corresponding differential inputs, and a switching network arranged to switch signals from the transconductance elements to a differential output,
    the first and the second harmonic rejection mixers have mutual quadrature phase relationship, and
    the plurality of mixer unit cells includes a plurality of shared mixer unit cells that are shared by the first harmonic rejection mixer and the second harmonic rejection mixer, wherein each shared mixer unit cell comprises:
        an input for receiving a signal to be mixed by the first and the second harmonic rejection mixers;
        an input for receiving control signals for controlling a respective shared mixer unit cell and derived from a local oscillator signal; and
        one output for each of the first and second harmonic rejection mixers,
    and wherein each of the plurality of shared mixer unit cells is arranged to also be operable in a high impedance state.

2. The mixer arrangement according to claim 1, further comprising:
    a third harmonic rejection mixer; and
    a fourth harmonic rejection mixer, wherein the third and the fourth harmonic rejection mixers share a second shared mixer unit cell comprising:
- an input for receiving a signal to be mixed by the third and the fourth harmonic rejection mixers;
- an input for receiving control signals for controlling the second shared mixer unit cell and derived from the local oscillator signal; and
- one output for each of the third and fourth harmonic rejection mixers such that the mixer arrangement forms a complex mixer.

3. The arrangement according to claim 1, further comprising a signal generation unit arranged to generate the control signals.

4. The arrangement according to claim 3, wherein the signal generation unit is arranged to provide a first set of binary control signals associated with polarity switching for respective output of the shared mixer unit cell, and provide a second set of binary control signals associated with current output for respective output of the shared mixer unit cell such that current at any time instant is output to only one of the respective outputs.

5. The arrangement according to claim 4, wherein at least two mixer unit cells are paired such that mixer unit cells of the pair cancel each other to produce a zero aggregate output such that all mixer unit cells are always active.

6. The mixer arrangement according to claim 4, wherein, for any of the shared mixer unit cells, the input for receiving the respective signal to be mixed comprises a differential input comprising a first and a second input terminal;
wherein the respective signal at each respective input terminal is supplied to a transconductance having an output that is switched to alternatively a first and a second output terminal of a differential output associated with one of the harmonic rejection mixers such that the respective signal derived from the first input terminal is coupled to the first output terminal thereof when the respective signal derived from the second input terminal is coupled to the second output terminal thereof and the respective signal derived from the first input terminal is coupled to the second output terminal thereof when the respective signal derived from the second input terminal is coupled to the first output terminal thereof, and switched to alternatively a first and a second output terminal of a differential output associated with another of the harmonic rejection mixers such that the respective signal derived from the first input terminal is coupled to the first output terminal thereof when the respective signal derived from the second input terminal is coupled to the second output terminal thereof and the respective signal derived from the first input terminal is coupled to the second output terminal thereof when the respective signal derived from the second input terminal is coupled to the first output terminal thereof; and
wherein the alternating switching for respective harmonic rejection mixer is controlled based on a signal derived from the first and second sets of control signals.

7. The arrangement according to claim 3, wherein the signals generated by the signal generation unit cause transconductances of the mixer unit cells to be assigned to the harmonic rejection mixers in a time-varying fashion such that, for each of the harmonic rejection mixers, transconductances vary in time in resemblance to a sinusoidal waveform.

8. The mixer arrangement according to claim 4, wherein, for any of the shared mixer unit cells, the input for receiving the respective signal to be mixed comprises a differential input comprising a first and a second input terminal;
wherein the respective signal at each respective input terminal is supplied to a transconductance and switched to alternatively a first and a second node such that the respective signal derived from the first input terminal is coupled to the first node when the respective signal derived from the second input terminal is coupled to the second node and the respective signal derived from the first input terminal is coupled to the second node when the respective signal derived from the second input terminal is coupled to the first node, and the respective signal derived from the first node is switched to alternatively a first output terminal of a differential output associated with one of the harmonic rejection mixers and a first output terminal of a differential output associated with another of the harmonic rejection mixers and the respective signal derived from the second node is switched to alternatively a second output terminal of a differential output associated with one of the harmonic rejection mixers and a second output terminal of a differential output associated with another of the harmonic rejection mixers; and
wherein the alternating switching for respective node is controlled based on a respective signal derived from the first and second sets of control signals and the alternating switching to respective output terminals of the harmonic rejection mixers is controlled based on the second set of control signals.

9. The mixer arrangement according to claim 7, wherein for one or more operation states some of the mixer unit cells are not in operation, and the control signals activate the high-impedance state to disable one or more of the mixer unit cells not in operation.

10. The arrangement according to claim 1, wherein each harmonic rejection mixer comprises an odd number of mixer unit cells.

11. The arrangement according to claim 1, wherein the mixer unit cells comprises switches switched in dependence on the control signals and arranged to selectively thereupon connect the signal from input to output of respective mixer unit cell.

12. The arrangement according to claim 11, wherein each mixer unit cell comprises a switch controller arranged to receive the control signals and provide control of switch operation of the switches of respective mixer unit cell based on the received control signals.

13. The arrangement according to claim 1, wherein all of the mixer unit cells, respectively, are structurally identical.

14. A radio circuit comprising a mixer arrangement according to claim 1.

15. A communication apparatus comprising a radio circuit according to claim 14.

* * * * *